United States Patent [19]

Pankove et al.

[11] 4,114,095
[45] Sep. 12, 1978

[54] SOLID STATE OSCILLOSCOPE

[75] Inventors: Jacques Isaac Pankove, Princeton; Frank Jerome Marlowe, Kingston, both of N.J.

[73] Assignee: RCA Corporation, New York, N.Y.

[21] Appl. No.: 775,864

[22] Filed: Mar. 9, 1977

[51] Int. Cl.$^2$ .................. G01R 13/20; G01R 13/00; G08B 23/00

[52] U.S. Cl. .......................... 324/121 R; 315/169 R; 324/149; 340/324 M

[58] Field of Search .......................... 324/121 R, 149; 315/169 R, 169 TV; 340/324 M, 336

[56] References Cited

U.S. PATENT DOCUMENTS 3,612,999 10/1971 Bergero .................. 324/149

OTHER PUBLICATIONS

Radio Elektronik Schau; Heft 12; 1976, p. 50.

Primary Examiner—Rudolph V. Rolinec
Assistant Examiner—Ernest F. Karlsen
Attorney, Agent, or Firm—H. Christoffersen; Samuel Cohen

[57] ABSTRACT

Compact oscilloscope in which the display, an array of light emitting diodes, is integral with the probe. The array continuously is scanned column by column at a controllable rate and concurrently voltages are applied to rows selected in accordance with the amplitude of the test waveform. Light is emitted from those diodes of the array receiving coincident row and column excitation to thereby display the test waveform.

6 Claims, 6 Drawing Figures

SOLID STATE OSCILLOSCOPE

This invention relates to a test oscilloscope.

Figure 1:
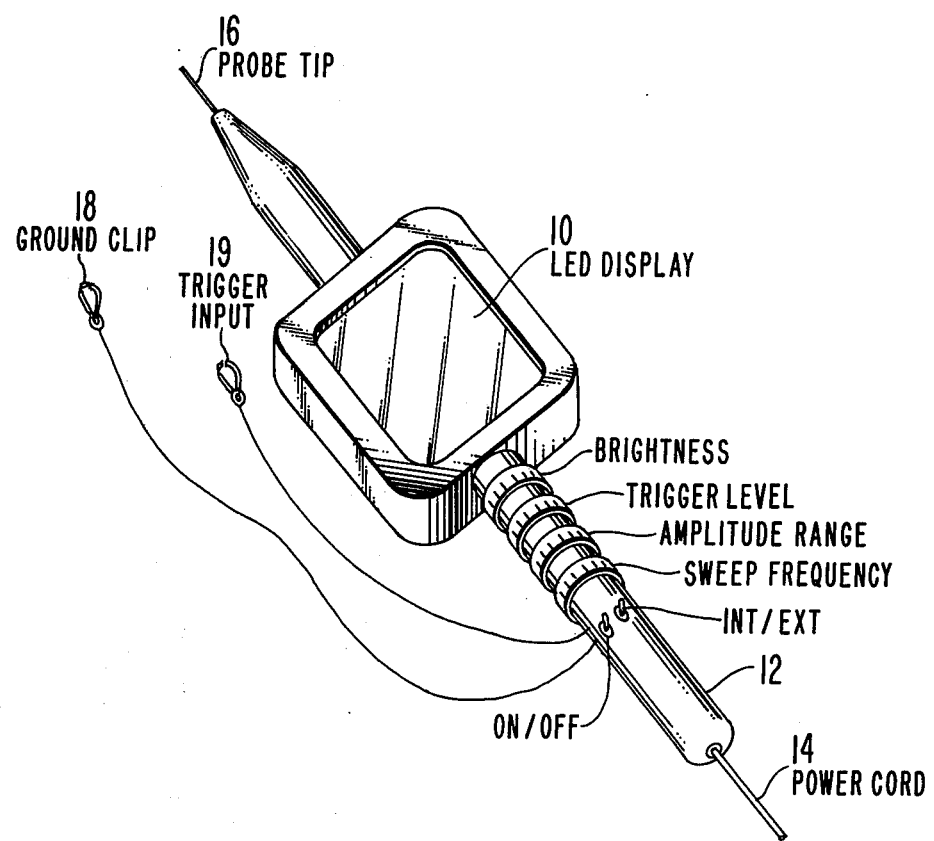
FIG. 1 is a perspective showing of a test oscilloscope embodying the invention.

The oscilloscope illustrated in FIG. 1 is a compact, solid state instrument having an insulated housing such as one formed of plastic, and a display 10, which is a light emitting diode (LED) display, integral with the probe. This oscilloscope is convenient for the trouble shooting of electronic circuits both because it is very small and therefore easy to handle, and also because it permits simultaneous viewing of the circuit being tested and of the waveform being displayed. The oscilloscope may be held by one hand at the handle 12. The various control knobs, the on/off switch and the internal-external synchronization switch are all mounted on the handle. A cord 14 connects either to an A.C. power supply or a battery pack. Alternatively, batteries may be included in the handle 12 and the cord 14 eliminated. The probe tip 16 may include a clip (not shown) at its end for allowing the oscilloscope to be hung on to the test point. A ground clip 18 and trigger input clip 19 also are included. The oscilloscope may also include the usual attenuator-compensator (not shown) for attenuating the input waveform.

Figure 2:
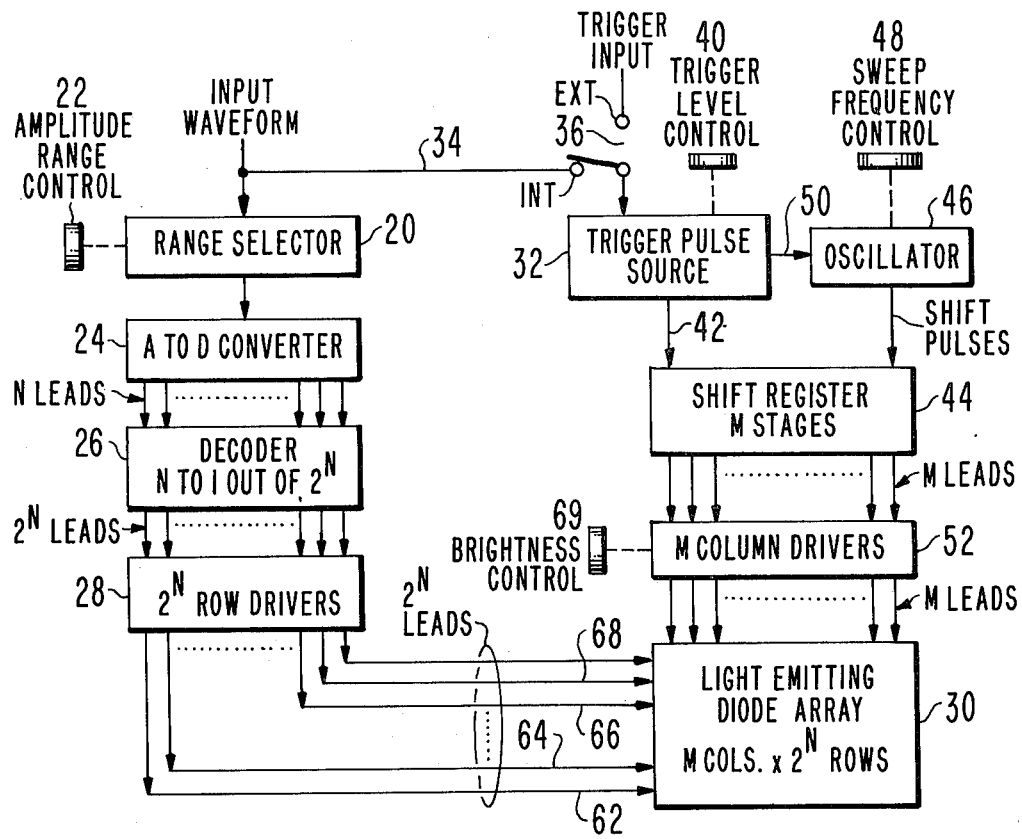
FIG. 2 is a block diagram of the oscilloscope of FIG. 1.

The complete system is illustrated in FIG. 2. The input waveform picked up by the probe tip 16 of FIG. 1 is applied to a range selector 20. The latter may include a voltage divider with a plurality of taps, as an example, for reducing the amplitude of the input wave to an appropriate level. The desired range may be selected by control knob 22 which may select one of the taps along the voltage divider, as an example. The output of the range selector is supplied to an analog-to-digital (A to D) converter 24 which translates the analog signal it receives to an N bit signal which appears at the N output leads, respectively, of the A to D converter. Assuming a relatively large array such as one having 256×256 elements, N would be 8. Of course, other values are possible, the number of bits in the code depending upon the number of rows in the array. In a less expensive instrument the array may be smaller, for example 64×64, and N would then be 6 (and M, which is discussed later, would be 64).

Figure 5:
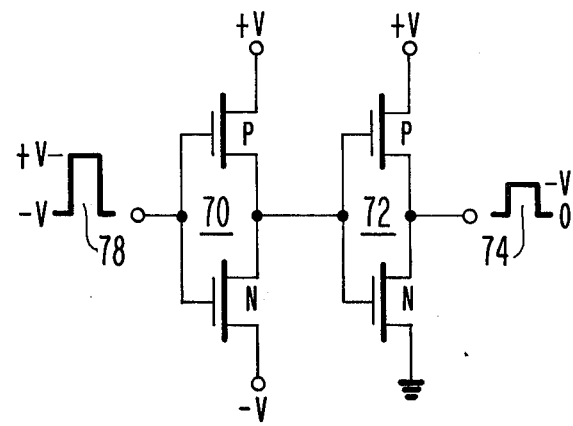
FIGS. 5 and 6 are schematic diagrams of suitable row and column driver circuits, respectively, for the display.

The A to D converter 24 connects to decoder 26. The latter's purpose is to translate the N bit input code it receives to a one out of $2^N$ output code. In other words, depending upon the value of the binary number represented by the parallel input signals applied to decoder 26, the decoder will produce a single output voltage which appears on one of the $2^N$ output leads of the decoder 26. In this particular system, the one of the leads carrying the signal will be at a level $+V$ and all other leads will be at a level $-V$, where V may be 10 volts or so. The one signal at level $+V$ is translated by one of the $2^N$ drivers 28 to a voltage of value V (a typical driver is shown in FIG. 5) and applied to the row of the light emitting diode array 30 which is connected to that driver.

The columns of the light emitting diode array 30 continuously are scanned, in sequence. The circuits for doing this are shown at the right of FIG. 2. They include a trigger pulse source 32 which produces periodic trigger pulses. The source 32 may be synchronized from the input waveform as indicated schematically by the line 34. This synchronization occurs when the internal-external switch 36 is in the "internal" position. Alternatively, the switch 36 may be in the "external" position in which case the trigger signal may be obtained from some external source to which the clip 19 (FIG. 1) connects. The trigger level control knob 40 is for the purpose of controlling the sensitivity of the trigger pulse amplifier within the source 32.

Each time a trigger pulse is generated by source 32, that pulse is applied via lead 42 to the first stage of shift register 44. This shift register has the same number of stages M as there are columns in the LED array 30. The pulse supplied to the first stage of a shift register continuously is shifted from stage to stage of the register until it reaches the output stage of the register and it is then shifted out of the register. The shift pulses are produced by oscillator 46 whose frequency may be controlled by adjusting the sweep frequency control knob 48. This oscillator may be free running but preferably it is synchronized by trigger pulses supplied via lead 50 from trigger pulse source 32.

As mentioned above, the trigger pulse source supplies an input pulse to shift register 44 and the latter continuously shifts this pulse until it reaches the last stage of the shift register. After this pulse is shifted out of the register, a new pulse is supplied to the input stage of the register via lead 42. The shift register has M output leads, one from each stage. When a stage receives a shift pulse, the output voltage present on the output lead of the stage changes from a value $+V$ to $-V$. Thus, there is present successive pulses on successive output leads of the shift register.

The M output leads of shift register 44 connect to M column drivers 52. Each time a column driver receives a negative pulse, it produces an output pulse of level $-v$, where $-v$ is somewhat less in amplitude than the absolute value of the pulse applied by one of the drivers 28 to a row of the array 30. As the oscillator 46 operates continuously, the successive output leads of the column drivers receive successive pulses, respectively, so that the array 30 continuously is scanned column by column sequentially.

Figure 3:
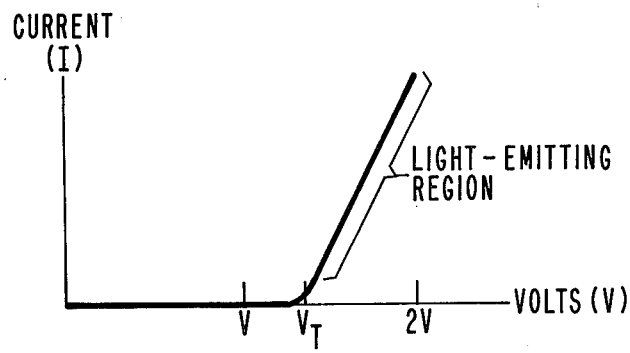
FIG. 3 is a graph of the current versus voltage characteristic of a light emitting diode suitable for use in the present invention.
Figure 4:
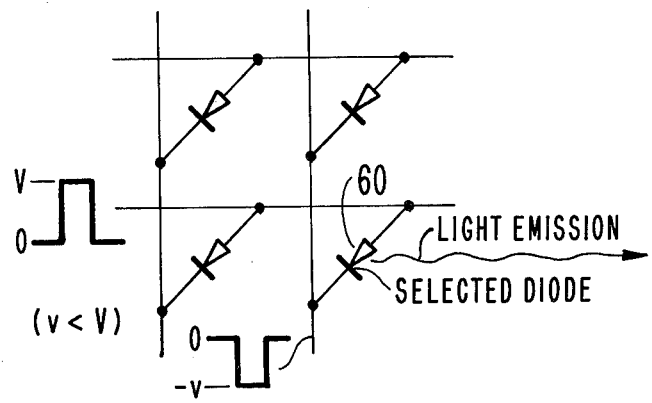
FIG. 4 is a schematic showing of a portion of a light emitting diode display.

Before discussing the overall operation, FIGS. 3 and 4 should be referred to briefly. FIG. 3 illustrates the current versus voltage characteristic of a single light emitting diode. The diode has a threshold voltage $V_T$ somewhat greater than V. If a voltage is applied across the diode of a value greater than this threshold value and say in the region $V_T$ to $2V$, the diode will emit light. In the present system, as will be discussed shortly, at any one instant of time only one of the diodes in the array will receive a voltage in the range $V_T$ to $2V$ and will therefore emit light. Of the remaining diodes in the array, most will receive no voltage; the others will receive a "half-select" voltage, that is, a voltage at a level V or at a level $-v$ where $-v$ is less than V in absolute magnitude. Accordingly, all of these remaining diodes will be in the off condition, that is, they will not emit light.

FIG. 4 illustrates a small portion of the array 30. A selected row of the array will receive a voltage at a level $+V$ and concurrently a selected column of the array will receive a voltage at a level $-v$ such that the sum $+V-(-v)=V+v$ will be greater than $V_T$. The result will be that the diode at the intersection of the selected column and row, diode 60 in the example illustrated in FIG. 4, will emit light and all remaining diodes will be off.

Returning now to FIG. 2, in the operation of the system the columns of the array 30 continuously are scanned in sequence. The input waveform is translated to a digital quantity by A to D converter 24 and the decoder 26, in response thereto, actuates one of the drivers 28. The row driver selected in any particular time slot will depend upon the level of the input waveform during that time slot. For example, a relatively low level signal will cause an output lead, such as 62 or 64, which connects to one of the lower rows of the array, to receive a drive voltage, whereas an input signal at a higher level will cause an output lead, such as 66 or 68, which connects to one of the higher rows of the array, to receive a drive voltage. Whichever occurs, the LED at the intersection of the selected column and the selected row will be energized and emit light. As the array continuously is scanned in the horizontal direction and concurrently is driven by the input waveform to energize selected rows of the array in accordance with the amplitude of the input waveform, the display 30 will produce, on its face, a luminescent trace corresponding to the shape of the input waveform.

It is assumed in the discussion above that the amplitude of the input wave varies relatively slowly compared to the time any one column of the array is receiving an excitation voltage. In other words, the input wave amplitude is substantially constant during this short interval so that during the time any particular column is selected one and only one row is concurrently receiving a drive voltage. If the input wave amplitude varies during this short interval of time, more than one LED diode may be actuated during the time a column is selected and, in this case, the actuated diodes will simulate a vertical trace.

With minor modification, the system can be made to cause only a single LED to be actuated during each column time, even with a rapidly changing input waveform. In this modified circuit, the A to D converter includes in its output circuit an N stage storage register for temporarily storing the N bit output word produced thereby. This register may be reset and conditioned to accept a new input N bit word once each shift period of register 44 in response to the shift pulses produced by oscillator 46. Each binary word will then remain staticized in this temporary storage register within the A to D converter for the period that a column is receiving column excitation.

The intensity of the light emitted by the LED's may be controlled by adjustment of the gain of the column or the row drivers. For purposes of the present illustration, a manual gain control for the column drivers is illustrated at 69. In addition, as already mentioned, the trigger pulse level, the column sweep frequency and so on, also may be controlled in the present system by the adjustments discussed.

In a preferred form of the present invention, the display comprises a monolithic display, that is, all of the semiconductor LED's are integrated onto a common substrate. Further, many of the circuits also are integrated onto the same substrate as the light emitting diodes. In one form of the invention, silicon-on-sapphire (SOS) substrates may be employed. The monolithic integration of coder, decoder and LED's eliminates the costly interconnections that would be required with discrete components. For even greater compactness, the sapphire can be coated with epitaxial silicon on both sides and interconnections between the two SOS surfaces can be achieved by metallized holes through the sapphire. If desired, some of the functions performed which require very few leads may be fabricated on separate chips and then connected to the display chip.

Figure 6:
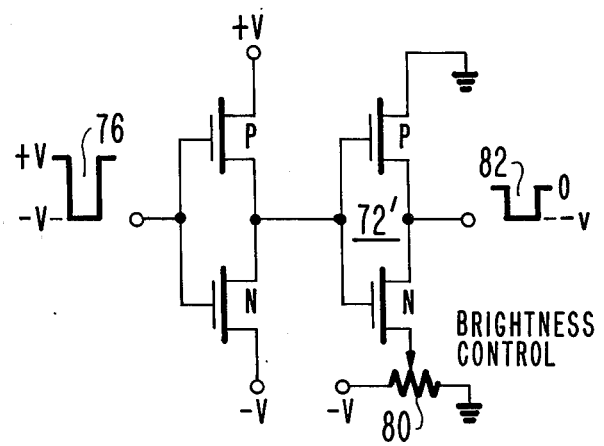

Assuming the display has say 250 columns and the maximum frequency of the oscillator 46 is 10 MHz, then the maximum sweep repetition rate is $40 \times 10^3$/seconds and the minumum time per resolution element is 100 nanoseconds (ns). This implies that the row selection circuits are able to follow 100 ns changes in the input waveform. Suitable driver circuits which are operative at these frequencies comprise complementary symmetry, metal oxide semiconductor (COS/MOS) circuits employing SOS technology. Such circuits are illustrated in FIGS. 5 and 6, FIG. 5 showing one row driver stage and FIG. 6 one column driver stage. In FIG. 5 the input signal varies between levels $-V$ and $+V$ and is applied to the gate electrodes of the first COS/MOS inverter amplifier 70. This amplifier, comprising a P channel device in series with an N channel device, is connected between two power supply terminals receptive of voltages $+V$ and $-V$, respectively. This amplifier is followed by a second inverter 72 employing complementary transistors but connected between $+V$ and ground terminals, respectively, to provide an output wave 74 which has a zero volt base line and an amplitude $+V$.

The driver of FIG. 6 is similar to the driver of FIG. 5 except that the input signal 76 is of opposite sense to the input signal 78 of the driver of FIG. 5; also the operating voltages for the second inverter 72' are complementary to those of the inverter 72 of FIG. 5. In addition, a potentiometer 80 may be included which is connected between the $-V$ terminal and ground, and the tap thereof connected to drain electrode of the N channel transistor. This potentiometer, which is common to all column drivers, serves as the brightness control, that is, it controls the amplitude of the column drive pulse 82.

The circuits of FIGS. 5 and 6 may be fabricated using silicon-on-sapphire substrates by ion implantation or by diffusion using photolithographic techniques well known in the art. At the same time stripes of conducting silicon may be formed over the display area. By way of example, the LED material may be gallium nitride (GaN) which emits in the visible region of the spectrum and which can be grown epitaxially on SOS in the manner discussed in U.S. Pat. No. 3,922,703 issued to J. I. Pankove, one of the present Joint inventors.

As briefly mentioned, it is also possible to construct an oscilloscope embodying the present invention with a separate chip for the display and separate IC chips. In the case of a separate display chip, the conducting silicon stripes may be replaced by conducting undoped GaN stripes. In this form of structure, an insulating layer of GaN forms the active luminescent region at the intersections of the X and Y addressing grid which may be made of transparent conducting, undoped GaN stripes. If desired, non-uniform doping may be employed along the thickness of this region to allow color display depending upon the polarity of the bias voltage applied across the insulating layer as described in U.S. Pat. No. 3,783,353, also issued to J. I. Pankove.

What is claimed is:

1. An oscilloscope comprising, in combination:
    a display comprising a plurality of columns and a plurality of rows of light affecting elements integrated onto a common sapphire substrate, each element being capable of assuming one of two optically distinguishable conditions, each element being responsive to coincident selection signals, one on a column, the other on a row, for being placed in said one condition and each remaining in its other condition in response to only one of said selection signals;
    means integrated onto the same substrate as said display responsive to a test waveform for selecting particular rows of the display during successive time slots, the row selected depending upon the amplitude of said waveform during that particular time slot that the selection takes place, and for supplying to each selected row a selection signal only during the time the row is selected; and
    means also integrated onto the same substrate as said display for applying to said plurality of columns, a corresponding plurality of selection signals, respectively, said selection signals occurring in time sequence and being applied in succession to the successive columns, each said selection pulse applied to a row being time coincident with one of said selection pulses applied to a column.

2. An oscilloscope as set forth in claim 1, wherein said display comprises an array of light emitting diodes.

3. An oscilloscope as set forth in claim 1, wherein said means responsive to said test waveform comprises:
    an analog-to-digital converter for translating the instantaneous amplitude of the test waveform to a group of signals in parallel representing a binary number; and
    means, including a decoder responsive to the value of the binary number represented by said group of signals, for selecting the particular rows of said display to receive a selection signal during said successive time slots.

4. An oscilloscope as set forth in claim 1, wherein said means for applying selection signals to said columns comprises:
    a shift register having a number of stages at least equal to the number of columns in said display, each stage connected to a different column;
    means for periodically inserting into the first of said stages a signal representing one binary value, all other stages storing signals representing the other binary value; and
    means for shifting said one signal inserted into said register from stage-to-stage of said register until it reaches the last stage of said register.

5. An oscilloscope as set forth in claim 1, further including:
    a housing which may be held in the hand comprising a hand grasp at one end thereof, a probe tip at another end thereof and a hollow region between the two, said display being located in said hollow region and having a visible face; and wherein said means responsive and means for applying comprise integrated circuit means within said hollow region connected to said probe tip and to said display for producing on said face a visible analog display of the signal picked up by said tip when the latter couples to a test point of a circuit under test.

6. An oscilloscope as set forth in claim 5, further including control knobs located on said hand grasp for controlling the operation of said oscilloscope.

* * * * *